United States Patent
Peng (10) Patent No.: US 9,490,260 B2
(45) Date of Patent: Nov. 8, 2016

(54) METHOD FOR FABRICATING A SEMI-FLOATING GATE TRANSISTOR

(71) Applicant: SEMICONDUCTOR MANUFACTURING INTERNATIONAL (SHANGHAI) CORPORATION, Shanghai (CN)

(72) Inventor: Kun Peng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/631,838

(22) Filed: Feb. 25, 2015

(65) Prior Publication Data

US 2015/0333079 A1   Nov. 19, 2015

(30) Foreign Application Priority Data

May 14, 2014  (CN) .......................... 2013 1 0410801

(51) Int. Cl.
  *H01L 27/115*  (2006.01)
  *H01L 27/092*  (2006.01)
  *H01L 21/8238*  (2006.01)
  *H01L 27/105*  (2006.01)
  *H01L 29/423*  (2006.01)
  *H01L 29/66*  (2006.01)
  *H01L 21/28*  (2006.01)

(52) U.S. Cl.
  CPC ... *H01L 27/11521* (2013.01); *H01L 21/28273* (2013.01); *H01L 21/823807* (2013.01); *H01L 21/823814* (2013.01); *H01L 21/823828* (2013.01); *H01L 21/823842* (2013.01); *H01L 27/092* (2013.01); *H01L 27/1052* (2013.01); *H01L 29/42324* (2013.01); *H01L 29/6656* (2013.01); *H01L 29/66825* (2013.01)

(58) Field of Classification Search
  None
  See application file for complete search history.

(56) References Cited

U.S. PATENT DOCUMENTS

| | | | | |
|---|---|---|---|---|
| 7,307,309 B2 * | 12/2007 | Hao | .................. | H01L 21/28273 257/315 |
| 8,089,801 B2 * | 1/2012 | Wang | .................... | G11C 11/404 257/261 |
| 2013/0264648 A1 * | 10/2013 | Fujita | .................. | H01L 27/0248 257/356 |
| 2015/0303207 A1 * | 10/2015 | Liu | .................... | H01L 29/42336 257/316 |
| 2015/0318291 A1 * | 11/2015 | Liu | .................... | H01L 27/11521 257/316 |
| 2015/0325663 A1 * | 11/2015 | Wang | ................ | H01L 21/28273 257/316 |

* cited by examiner

*Primary Examiner* — Ali Naraghi
(74) *Attorney, Agent, or Firm* — Kilpatrick Townsend & Stockton LLP (57) ABSTRACT

A semi-floating gate transistor structure includes a substrate, a first N-well region and a second N-well region separated from each other in the substrate, and a gate oxide layer on the substrate. The gate oxide layer includes a separation groove disposed on the first N-well region. The semi-floating gate transistor structure further includes a P-type doped floating gate having a first portion filling the separation groove and a second portion integrally formed on the first portion. The first portion of the P-type doped floating gate and the first N-well region form a pn-junction diode.

13 Claims, 9 Drawing Sheets

METHOD FOR FABRICATING A SEMI-FLOATING GATE TRANSISTOR

CROSS-REFERENCES TO RELATED APPLICATIONS

The present application claims priority to Chinese patent application No. 201310410801.0, entitled "A METHOD FOR FABRICATING A SEMI-FLOATING GATE TRANSISTOR", filed with the State Intellectual Property Office of People's Republic of China on May 14, 2014, the content of which is incorporated herein by reference in its entirety.

TECHNICAL FIELD

The present invention relates to integrated circuits and processing of semiconductor devices. More particularly, the invention relates to a semi-floating gate transistor structure and method of manufacturing the same.

BACKGROUND OF THE INVENTION

Non-volatile memory devices are capable of storing data even with the power is turned off. Depending on the technology, writing or erasing data in a non-volatile memory device may require that a current flows through a silicon oxide dielectric layer which can have a thickness of a few nanometers, so that an operating voltage of about 20 V and a programming time of microseconds may be necessary.

Figure 1:
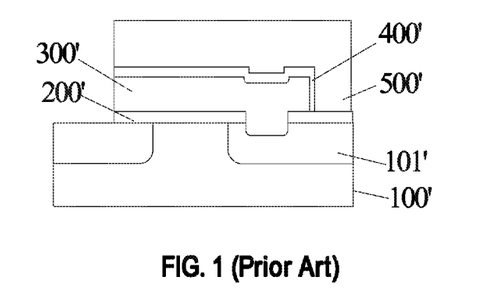
FIG. 1 is a cross-sectional view of a prior art semi-floating gate transistor.

There has been suggested the use of a field-effect transistor having a semi-floating gate structure for use as a non-volatile memory element. Compared to a conventional floating gate transistor erase operation that is performed by applying a high voltage to control electron tunneling through the insulating dielectric layer, the semi-floating-gate transistor with a silicon body TFET quantum tunneling effect, and the use of pn junction diode, in which the operating voltage can be reduced to 2V, can have a single data erase and write operation time down to 1.3 nanoseconds. FIG. 1 is a cross-sectional view of a semi-floating gate transistor structure of the prior art.

Figure 2:
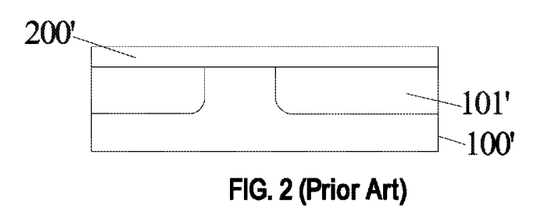
FIG. 2 is a cross-sectional view of a structure after a gate oxide layer is formed on the surface of an N-well region in a substrate of the prior art.

FIGS. 2 to 7 shows cross-sectional views of intermediate stages of a method for manufacturing the semi-floating gate transistor structure of FIG. 1 according to the prior art. The prior art method may include the following steps:

At step S1': an N-well region 101' is formed in a substrate 100', and a gate oxide layer 200' is formed on a surface of N-well region 101' and on a surface of substrate 100', as shown in FIG. 2.

Figure 3:
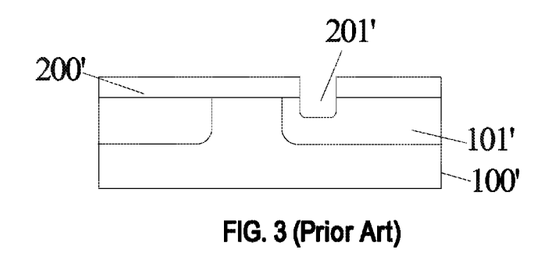
FIG. 3 is a cross-sectional view of the structure of FIG. 2 after etching to form a groove of the prior art.

At step S2'; gate oxide layer 200' and substrate 100' are etched to form a groove 201' in N-well region 101', as shown in FIG. 3.

Figure 4:
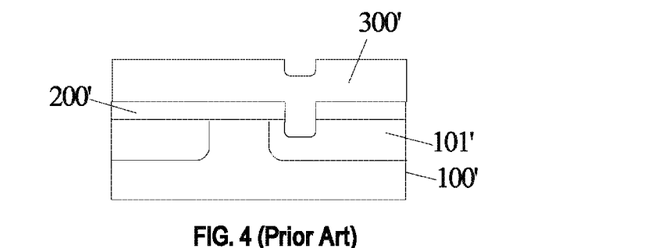
FIG. 4 is a cross-sectional view of the structure of FIG. 3 after deposition of P-type polysilicon layer on the gate oxide layer and on the groove of the prior art.

At step S3': a P-type polycrystalline silicon layer (alternatively referred to as p-type polysilicon layer) is formed on gate oxide layer 200' and filling groove 201', as shown in FIG. 4. A pn junction diode is formed between the P-type polycrystalline silicon layer and the N-well region.

Figure 5:
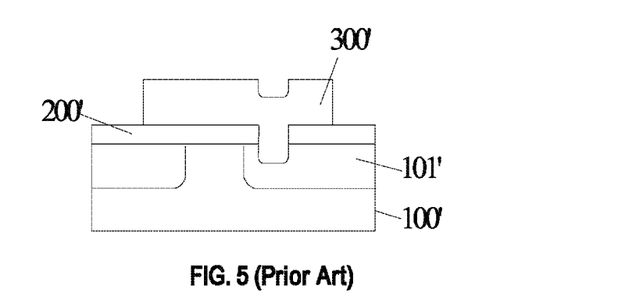
FIG. 5 is a cross-sectional view of the structure of FIG. 4 after etching of the P-type polysilicon layer of the prior art.

At step S4'; a portion of the p-type polysilicon layer 300' is removed by etching, as shown in FIG. 5.

Figure 6:
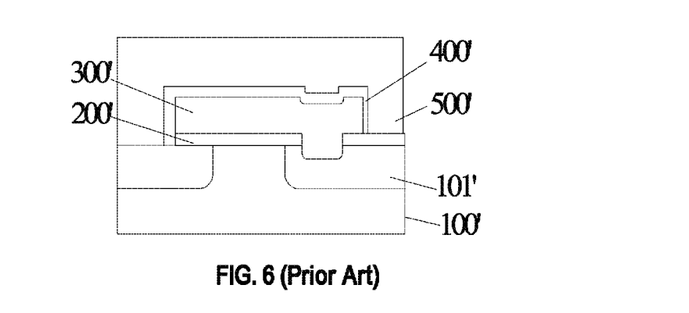
FIG. 6 is a cross-sectional view of the structure after deposition of an N-type polysilicon layer and an ONO layer on the P-type polysilicon layer of the prior art.

At step S5': an ONO layer 400' is formed on the P-type polysilicon layer, and an N-type polysilicon layer 500' is formed on the ONO layer 400', the gate oxide layer, and the N-well region 101'. The ONO layer 400' is a stack of silicon oxide layer, a silicon nitride layer and a silicon oxide layer forming a layered structure.

Figure 7:
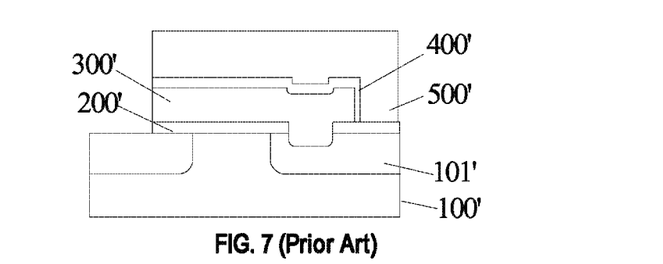
FIG. 7 is a cross-sectional view of the structure after etching of the N-type polysilicon layer and the ONO layer on the P-type polysilicon layer of FIG. 6 of the prior art.

At step S6'; N-type polysilicon layer 500' and the ONO layer 400' are sequentially removed by etching to form a structure, as shown in FIG. 7.

However, the above process steps of forming a groove further includes, after etching the gate oxide layer, etching the substrate, so that a portion of the floating gate electrode is formed in the substrate. Etching the substrate causes damage to the crystalline structure of the substrate, leading to an increase in the leakage current and power consumption of the semi-floating gate transistor device. Furthermore, the etching process and the lithographic minimum width capability determines the minimum feature size of the pn junction diode of the semi-floating gate device, and therefore, the above process is difficult to further reduce the size of the floating gate transistor. Moreover, when after the formation of the N-well region, the groove formed by etching, the boundary of N well region cannot be easily determined, and thus, the lithographic mask alignment accuracy is difficult to be determined, which may adversely affect the size of the channel. Therefore, it is difficult to form an effective pn junction diode. While such semi-floating-gate transistor structure provides the advantages of a fast erase time, but the size of the process using pn-junction diode formed as described above is greater than 0.5 microns, which makes it more difficult to apply a high degree of integration of semiconductor technology. Therefore, a technical solution of effectively improving data storage density with the continuous shrinkage in the size of a floating gate transistor with advances in semiconductor technology has become critical for the mass production of semiconductor devices.

BRIEF SUMMARY OF THE INVENTION

Embodiments of the present invention provide a semi-floating gate transistor structure and method for manufacturing the same to solve the problems associated damages to the crystalline structure of the substrate that are caused during etching leading to increase in leakage current and power consumption of the semi-floating gate transistor structure.

In an embodiment, a semi-floating gate transistor structure includes a substrate having a surface, a first N-well region and a second N-well region disposed in the substrate and being physically and electrically separated from each, and a gate oxide layer on the surface of the substrate comprising a separation groove. The separation groove is disposed on the first N-well region. The semi-floating gate transistor structure also includes a floating gate disposed on the surface of the substrate and being doped with a P-type dopant. The floating gate may include a first floating gate portion filling the separation groove and a second floating gate portion that is integrally formed with the first floating gate portion and disposed on the first floating gate portion and the exposed surface of the gate oxide layer.

The semi-floating gate transistor structure further includes a heavily doped N-type region that forms together with the first floating gate portion a pn junction structure. In an embodiment, the heavily doped N-type region has a concentration of n-type dopants in the range between $10^{15}$ and $10^{20}/cm^3$, and the doped P-type region has a concentration of p-type dopants in the range between $10^{15}$ and $10^{21}/cm^3$.

In an embodiment, the first N-well region has a groove corresponding to the location of the separation groove. The floating gate further includes a third floating gate portion that is integrated with the first floating gate portion and surrounded by the heavily doped N-type region.

In an embodiment, the semi-floating gate transistor structure further an interlayer dielectric layer disposed on the surface of the substrate assay from the floating gate, a control gate disposed on the surface of the interlayer dielectric layer.

In an embodiment, the control gate may be doped with either N-type dopants and P-type dopants having a concentration in the range between $10^{15}$ and $10^{21}$/cm$^3$.

Embodiments of the present invention also provide a method for manufacturing a semi-floating gate transistor structure. The method may include providing a substrate and a first N-well region and a second N-well region in the substrate at S1. The first and second N-well regions are separated from each other. The method also includes forming an oxide layer having a separation groove on the first N-well region at S2. The method further includes forming a P-type doped polysilicon layer filling the separation groove and overlying the oxide layer at S3.

In an embodiment, S3 may include performing an N-type ion implant into the exposed surface of the substrate and the oxide layer to form a heavily doped N-well region corresponding to the location of the separation groove at S31, and depositing a polysilicon layer on the oxide layer of the heavily doped N-well region, and performing a P-type ion implant while depositing the polysilicon layer to form a first P-type doped polysilicon layer at S32.

In another embodiment, S3 may include performing an N-type ion implant into the exposed surface of the substrate and the oxide layer to form a heavily doped N-well region corresponding to the location of the separation groove at S31', depositing a polysilicon layer on the oxide layer of the heavily doped N-well region at S32', and performing a P-type ion implant into the polysilicon layer to form a first P-type doped polysilicon layer at S33'.

In an embodiment, S2 may include forming a first oxide layer on the substrate and forming an etch stop layer on the first oxide layer at S21, sequentially etching the etch stop layer and the first oxide layer to form an opening at S22. The opening exposes a portion of the first N-well region and a portion of the second N-well region. S2 may further include forming a sidewall layer on the sidewalls of the opening at S23, forming a second oxide layer on the exposed substrate at S24, and removing the sidewall layer and the etch stop layer, forming a separation groove at the location of the sidewall layer, and forming an oxide layer on the etched first oxide layer, the etched second oxide layer, and the separation groove at S25.

In an embodiment, S23 includes depositing a sidewall material layer on the opening and on the etch barrier layer at S231, etching the sidewall material layer to form a sidewall layer at S232. The sidewall material layer and the etch stop layer are of the same material.

In an embodiment, depositing the sidewall layer may utilize a chemical vapor deposition and etching the sidewall layer may utilize an anisotropic etching at S231. The sidewall material layer comprises silicon nitride or silicon oxynitride.

In an embodiment, forming the first oxide layer and forming the etch stop layer at S21 utilize first thermal oxidation, and, forming the second oxide layer at S24 utilizes second thermal oxidation.

In an embodiment, S25 further includes removing the sidewall layer and the etch stop layer, forming the separation groove at the location of the sidewall layer, etching the substrate to extend the separation groove into the substrate using the second oxide layer and the etched first oxide layer as a mask.

In an embodiment, the method further includes, after S3, forming an insulating layer on the first polysilicon layer, forming an N-type doped second polysilicon layer, sequentially etching the N-type second polysilicon layer, the insulating layer, the first polysilicon layer, and the oxide layer so that the etched oxide layer is the gate insulating layer, the etched first polysilicon layer is the floating gate, the etched insulating layer is the interlayer dielectric layer, the etched second polysilicon is the control gate of the semi-floating gate transistor structure. In a specific embodiment, the insulating layer is an ONO layer.

Embodiments in accordance with the present invention overcome the problems associated with etching the substrate that may damage the crystalline structure leading to an increase in leakage current and power consumption. By maintaining the P-type doped floating gate over the surface of the substrate, there is no need for etching the substrate, thus avoiding damages to the crystalline structure of the substrate.

The following description, together with the accompanying drawings, will provide a better understanding of the nature and advantages of the claimed invention.

DETAILED DESCRIPTION OF THE INVENTION

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

The term "horizontal" as used in his application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

As described above, the prior techniques involve etching of the substrate after etching of the gate oxide layer to form a portion of the floating gate may cause damage to the crystalline structure of the substrate and result in an increase in leakage current and power consumption of the semi-floating gate transistor. Embodiments of the present invention provide a semi-floating gate transistor structure and method for manufacturing the semi-floating gate transistor structure to solve these problems associated with damages to the crystalline structure.

Figure 8A:
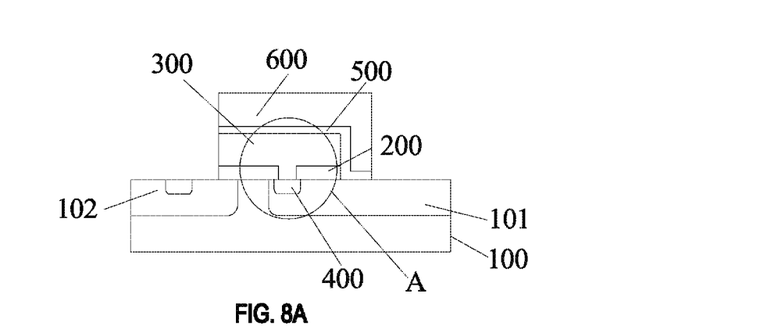
FIG. 8A is a cross-sectional view of a semi-floating gate transistor structure according to an embodiment of the present invention.
Figure 8B:
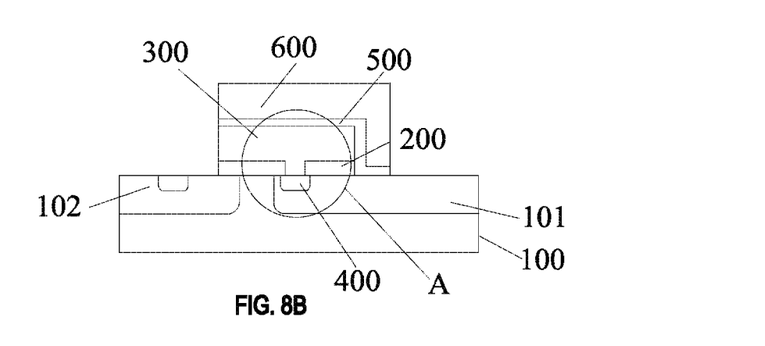
FIG. 8B is a cross-sectional view of a semi-floating gate transistor structure according to another embodiment of the present invention.
Figure 9:
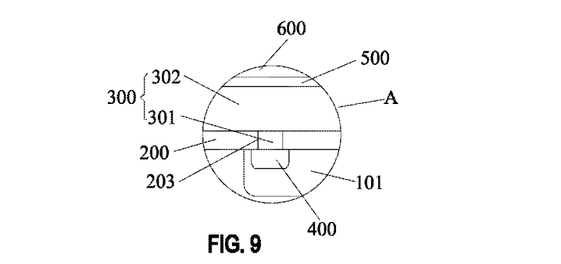
FIG. 9 is an enlarged cross-sectional portion A of FIGS. 8A and 8B.

Cross-sectional views of exemplary embodiments of a semi-floating gate transistor structure are shown in FIGS. 8A and 8B. FIG. 9 is a cross-sectional view of an enlarged portion A of FIGS. 8A and 8B. According to embodiments of the present invention, a semi-floating gate transistor structure may include a substrate 100 having a surface, a gate oxide layer 200, and a floating gate 300. Substrate 100 includes a first N-well region 101 and a second N-well region 102 that are separated from each other. Gate oxide layer 200 is disposed on the surface of substrate 100. In conjunction with FIGS. 9 and 10, gate oxide layer 200 includes a separation groove 203 that is formed on the surface of the substrate at a location of first N-well region 101. Floating gate 300 is disposed on the surface of the substrate 100 and doped with a P-type dopant. Floating gate 300 includes a first floating gate portion 301 filling separation groove 203 and a second floating gate portion 302 that is integrally formed with first floating gate portion 301 and disposed on first floating gate portion 301 and the exposed surface of gate oxide layer 200.

The above-described semi-floating gate transistor structure has a pn-junction diode that is formed from P-type doped floating gate 300 disposed on the surface of substrate 100. Thus, there is no need for etching substrate 100 which may cause damage to the crystalline structure of the substrate and result in an increase in leakage current and power consumption of the semi-floating gate transistor structure.

In an embodiment, the N-type dopants of the N-well region may include group VI elements (such as phosphorus, arsenic, or antimony), and the P-type dopants may include group III elements (such as boron, gallium, or indium).

In an embodiment, separation groove 203 may be formed by a wet etching or a dry etching. In a preferred embodiment, in order to avoid deviations in the isotropic wet etching or damage to the surface of the substrate caused by a dry etching, the semi-floating gate transistor structure may further include a heavily-doped N-type region 400 in substrate 100 that forms with first floating gate portion 301 the pn-junction structure. By having a pn-junction diode forming with heavily-doped N-type region 400 and P-type doped floating gate 300, not only the accuracy of the positional relationship between N-type heavily-doped region 400 and P-type doped floating gate 300 can be ensured, but also potential damage to the surface caused by etching can be reduced or eliminated. The pn-junction diode having this structure benefits from an increase in carrier concentration and erase speed.

In an embodiment, heavily doped N-type region 400 has an N-type doping concentration in the range between $10^{15}$ and $10^{20}$/cm$^3$, and P-type doped floating gate 300 region has a P-type doping concentration in the range between $10^{15}$ and $10^{21}$/cm$^3$.

Figure 10:
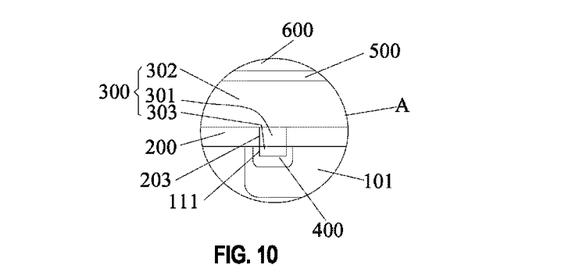
FIG. 10 is an enlarged cross-sectional portion A of FIG. 8A.

As described above, many problems associated with etching inaccuracy and surface damage can be avoided with the use of N-type heavily-doped region 400. In an embodiment, the semi-floating gate transistor structure may further include a groove 111 disposed in first N-well region 101 at a location corresponding to separation groove 203, and floating gate 300 further includes a third floating gate portion 303 that is entirely surrounded by heavily doped N-type region 400, as shown in FIG. 10. The use of heavily-doped N-type region 400 described herein fully overcomes the problems associated etching inaccuracy or deviation and surface damage of the pn-junction diode. Therefore, by further extending floating gate 300 into N-type heavily-doped region 400 toward substrate 100, the contact area between floating gate 300 and N-type heavily-doped region 400 is increased to thereby improve the carrier flow rate and the erase speed of the device.

Still referring to FIGS. 9 and 10, the semi-floating gate transistor structure may further include interlayer dielectric layer 500 disposed on floating gate 300 and control gate 600 disposed on interlayer dielectric layer 500.

In an embodiment, control gate 600 may be doped with N-type or P-type dopants having a concentration in the range between $10^{15}$ and $10^{21}$/cm$^3$ to effectively and accurate adjust the threshold voltage of the floating gate.

Figure 11:
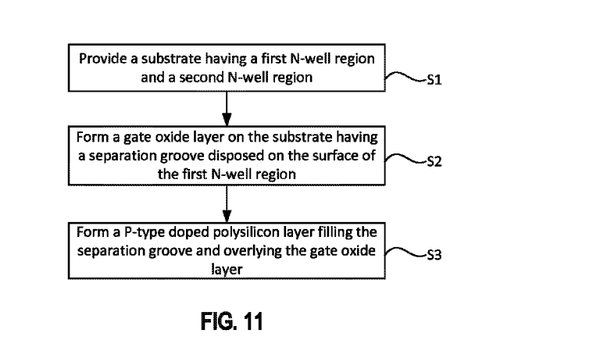
FIG. 11 is a flow chart of a method for fabricating a semi-floating gate transistor structure according to an embodiment of the present invention.

The present invention is further directed to a method for manufacturing a semi-floating gate transistor structure having reduced leakage current and power consumption. As shown in FIG. 11, the method includes: providing a substrate 100, and forming a first N-well region 101 and a second N-well region in the substrate at S1. First and second N-well regions physically and electrically separated from each other. The method also include forming an oxide layer 200' and a separate groove 203 in a portion of oxide layer 200' disposed over first N-well region 101 at S2, and forming a polysilicon layer 300' doped with a P-type dopant on separation groove 203 and oxide layer 200' at S3.

The semi-floating gate transistor structure, in accordance with the above-described method, includes oxide layer 200' in separation groove 203, there is no need to submit substrate 100 to etching, thereby preventing issues related to damages of the crystalline structure of substrate 100 and associated leakage current and power consumption of the semi-floating gate transistor structure.

Embodiments of the present invention will be described in detail below. In the embodiments, identical reference numerals are used to mark identical or similar elements. It is to be understood that these embodiments are solely provided to explain the nature and benefits of the invention and do not limit the invention. For clarity reasons, some elements are enlarged in relation to other elements.

Figure 12:
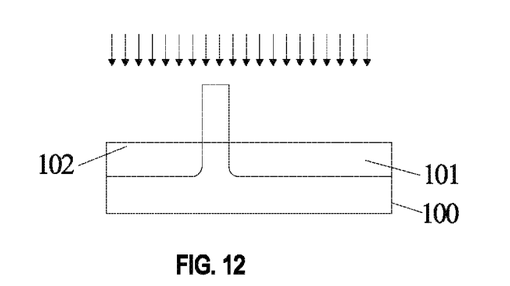
FIG. 12 is a cross-sectional view of a semi-floating gate transistor structure having a first N-well region and a second N-well region that are separated from each other according to an embodiment of the present invention.

According to an embodiment, a method for manufacturing a semi-floating gate transistor structure includes the following steps:

S1: providing a substrate 100 having a first N-well region and a second N-well region in the substrate. First and second N-well regions are separated from each other. S1 also includes depositing a photoresist on substrate 100 and patterning the photoresist to form an opening at a desired location of first and second N-well regions 101, 102. N-type dopants are implanted into substrate 100 to form first and second N-well regions 101, 102. The N-type dopants may include group VI elements, such as phosphorus, arsenic, or antimony.

Figure 18:
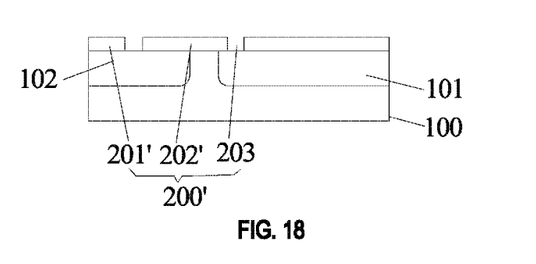
FIG. 18 is a cross-sectional view of a semi-floating gate transistor structure after removing the sidewall material layer and the etch stop layer of FIG. 17, in accordance with an embodiment of the present invention.

S2: forming an oxide layer 200' having a separation groove 203 disposed at a region of first N-well region 101, as shown in FIG. 18. Oxide layer 200' may be formed using different processes. Some of the exemplary processes of forming the oxide layer 200' may include forming an oxide layer, etching the oxide layer to form a separation groove 203. The Oxide layer may be formed by deposition or oxide growth. In a specific embodiment, oxide growth can be performed using any conventional oxide layer growth techniques known in the art. Etching the oxide layer may be a conventional anisotropic dry etching or isotropic wet etching. Dry etching may provide separation groove 203 with vertical sidewalls, in which a pn-junction diode formed by a P-type floating gate filling separation groove and N-well region has better performance. A wet etching may not cause damage to substrate 100 to thereby improve the performance of the pn-junction diode.

Figure 13:
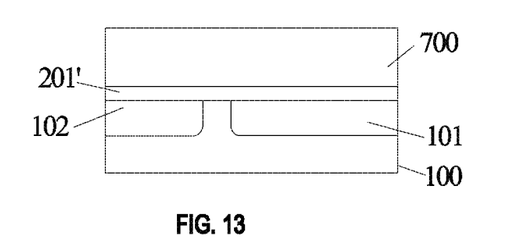
FIG. 13 is a cross-sectional view of a semi-floating gate transistor structure illustrating a first oxide layer on the substrate and an etch stop layer on the first oxide layer of FIG. 12, in accordance with an embodiment of the present invention.

Some other exemplary processes of forming the oxide layer 200' may include forming a first oxide layer 201' on substrate 100 and forming an etch stop layer 700 on first oxide layer 201', as shown in FIG. 13. Etch stop layer 700 may be formed using a chemical vapor deposition such as with silane (SiH$_4$) and ammonia (NH$_3$) at the atmospheric pressure, or using dichloro-dihydro silicon (SiCl$_2$H$_2$) and ammonia carried out at low pressure and at temperature between 700 to 800 degrees C., or using plasma enhanced chemical vapor deposition of silicon nitride at or below 350 degrees C. at S21.

Figure 14:
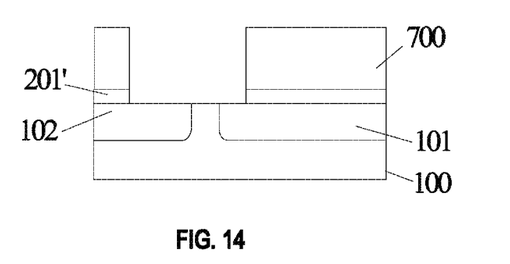
FIG. 14 is a cross-sectional view of a semi-floating gate transistor structure having an opening formed though the etch stop layer and the first oxide layer, in accordance with an embodiment of the present invention.

The process of forming the oxide layer 200' may further include sequentially etching barrier layer 700 and first oxide layer 201' to form an opening exposing a surface of first N-well region 101 and a surface of second N-well region 102 at S22. FIG. 14 illustrates a cross-sectional view of the structure at this stage. A conventional etching process can be used at S22. In a preferred embodiment, an anisotropic dry etching can be used including CF$_4$, O$_2$, and N$_2$ gas for etching etch barrier layer 700 comprising silicon nitride. Thereafter, when etching first oxide layer 201', the content of oxygen and nitrogen may be reduced. In an embodiment, CF$_4$ may be replaced with SiF$_4$, NF$_3$, CHF$_3$, or C$_2$F$_6$.

Figure 16:
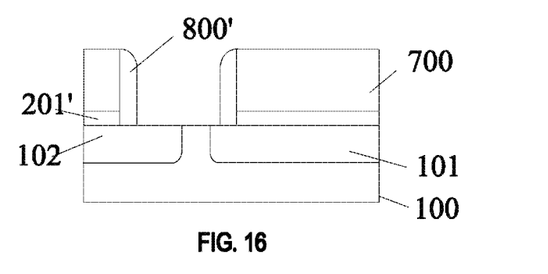
FIG. 16 is a cross-sectional view of a semi-floating gate transistor structure after anisotropic etching the sidewall material layer of FIG. 15, in accordance with an embodiment of the present invention.

The process of forming the oxide layer 200' may further include forming a sidewall layer 800 on the sidewalls of the opening at S231, and etching sidewall layer 800 to form a sidewall structure 800' at S232, as shown in FIG. 16. Sidewall structure 800' may have the same material as that of etch stop layer 700, such as silicon nitride or silicon oxynitride.

Figure 15:
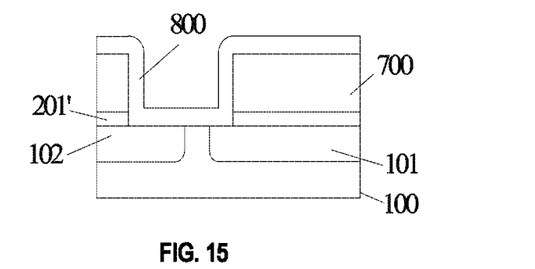
FIG. 15 is a cross-sectional view of a semi-floating gate transistor structure after depositing a sidewall material layer of FIG. 14, in accordance with an embodiment of the present invention.

Forming the sidewall layer 800 at S231 can be carried out using a chemical vapor deposition, preferably using a low pressure chemical vapor deposition, or a plasma enhanced chemical vapor deposition to form a conformal layer on vertical sidewalls and on the bottom of the opening and on the surface of etch barrier layer 700. Etching at S232 may be an anisotropic dry etching to produce a structured sidewall layer 800'. In a preferred embodiment, sidewall layer 800 and etch stop layer 700 may have the same material to facilitate the subsequent removal of the sidewall layer 800 and etch stop layer 700.

Figure 17:
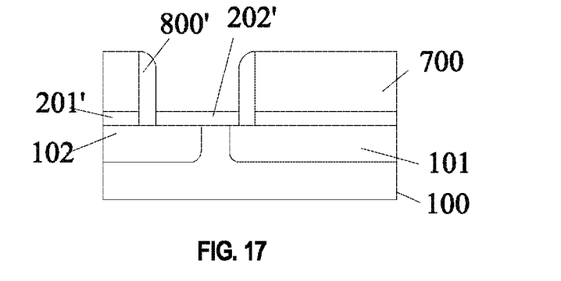
FIG. 17 is a cross-sectional view of a semi-floating gate transistor structure after forming a second oxide layer on the exposed surface of the substrate of FIG. 16, in accordance with an embodiment of the present invention.

The method further includes, after sidewall structure 800' has been formed, forming a second oxide layer 202' on the exposed surface of substrate 100 at S24, as shown in FIG. 17. Second oxide layer 202' can be formed using an oxide growth process or a deposition process. In a preferred embodiment, second oxide layer 202' may be formed using a thermal oxidation process. Second oxide layer 202' has a thickness that is substantially equal to the thickness first oxide layer 201, which is in the range between 20 to 500 Angstroms.

After forming second oxide layer 202', the method further includes removing sidewall structure 800' and etch stop layer 700 to form a separation groove 203 at S25, as shown in FIG. 18. After the removal of sidewall 800' and etch stop layer 700, oxide layer 200' includes a first oxide layer 201', a second oxide layer 202', and a separation groove 203.

In a preferred embodiment, sidewall structure 800' and etch stop layer 700 can be removed using a wet chemical etching. For example, if sidewall structure 800' and etch stop layer 700 include silicon nitride, phosphoric acid at about 160 degrees C. can be used. Since phosphoric acid has a relatively high selectivity, no damage will be caused to first oxide layer 201' and second oxide layer 202'.

In the process of forming oxide layer 200' having a separation groove 203, by using the opening to expose a surface of substrate 100 and by controlling the thickness of the sidewall structure formed on the opening, a position of the pn-junction diode can be determined with precision without relying on an accurate alignment of the optical mask to realize the position of the pn-junction diode. Moreover, the size of sidewall structure 800' can be adjusted through the deposition conditions at S231 and etching conditions at S232, the line width thus does not depend on the capability of the lithographic apparatus to manufacture a small size pn-junction diode.

In an embodiment, after forming separation groove 203, in order to further improve the erase speed of the pn-junction diode, S25 may further include removing the sidewall structure 800' and etch stop layer 700 to form separation groove 203, and using second oxide layer 202' and first oxide layer 201' as a mask to etch substrate 100, to thereby extend separation groove 203 into substrate 100. The extension of separation groove 203 into the substrate increases the contact area of the pn-junction diode to thereby improve the programming (erase and write) speed.

Figure 20:
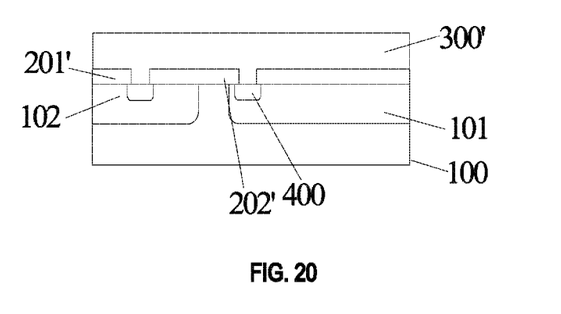
FIG. 20 is a cross-sectional view of a semi-floating gate transistor structure having a P-type doped first polysilicon layer of FIG. 19, in accordance with an embodiment of the present invention.

The method further includes forming a first P-type doped polysilicon layer 300' in separation layer 203 and on oxide layer 200' at S3, as shown in FIG. 20.

Figure 19:
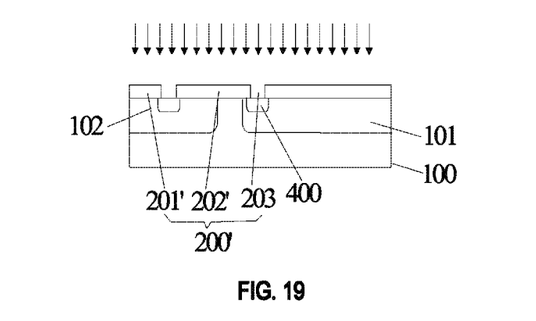
FIG. 19 is a cross-sectional view of a semi-floating gate transistor structure illustrating an ion implant being performed intoon the exposed surface of the substrate and the second oxide layer, in accordance with an embodiment of the present invention.

In a preferred embodiment, S3 may include performing an ion implant of N-type dopants into substrate 100 and oxide layer 200' to form a heavily doped N-type region 400 at S31, as shown in FIG. 19, and depositing a first P-type polysilicon layer 300' on heavily doped N-type region 400 and oxide layer 200' while concurrently performing an ion implant of P-type dopants at S32.

In an embodiment, prior to forming first polysilicon layer 300', S3 includes forming a pn-junction diode from heavily doped N-type region 400 and P-type doped floating gate 300. The thus formed pn-junction process not only ensures the accuracy of the positional relationship between heavily doped N-type region 400 and P-type doped floating gate 300, but also reduces the surface damage of the substrate caused by etching to thereby increase the carrier concentration and the erase speed of the pn-junction diode. In a preferred embodiment, heavily doped N-type region 400 is doped at an N-type doping concentration in the range between $10^{15}$ and $10^{20}/cm^3$, and P-type doped floating gate 300 region is doped at a P-type doping concentration in the range between $10^{15}$ and $10^{21}/cm^3$, and at an energy in the range between 10 KeV and 100 keV, the process parameters may be chosen dependent from the thickness of the control gate. P-type doped first polysilicon layer 300 can be formed by using the side-edge doping deposition, and the concentration of the P-type impurity can be simultaneously controlled through the P-type doping concentration during the deposition.

In an embodiment, S3 further includes performing an ion implant of N-type dopants into the exposed surface of substrate 100 and oxide layer 200' and forming a heavily doped N-type region 400 at S31'. S3 also includes forming a polysilicon layer on heavily doped N-type region 400 and oxide layer 200' at S32', and performing ion implant into the polysilicon layer to form a P-type doped first polysilicon layer 300' at S33'. In this embodiment, the polysilicon layer is first deposited, and the polysilicon layer is then submitted to ion implantation to form P-type doped first polysilicon layer 300', and the concentration of the P-type doped first polysilicon layer can be controlled by controlling the dose of the ion implantation.

After forming first polysilicon layer 300', a pn-junction can be formed through the portion of first polysilicon layer 300' disposed in separation groove 203 and heavily doped N-type region 400. Thereafter, a floating gate, a control gate, and other structures cam be further formed using conventional process techniques.

Figure 21:
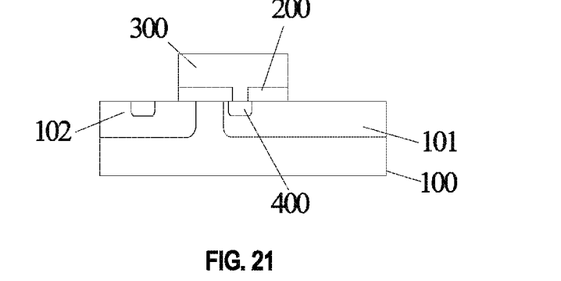
FIG. 21 is a cross-sectional view of a semi-floating gate transistor structure illustrating the first polysilicon layer and the oxide layer of FIG. 20, in accordance with an embodiment of the present invention.
Figure 22:
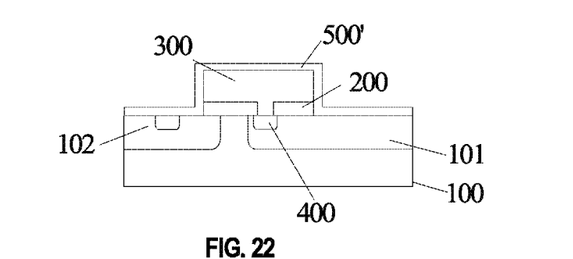
FIG. 22 is a cross-sectional view of a semi-floating gate transistor structure illustrating an insulating layer on the floating gate and the exposed substrate of FIG. 21, in accordance with an embodiment of the present invention.
Figure 23:
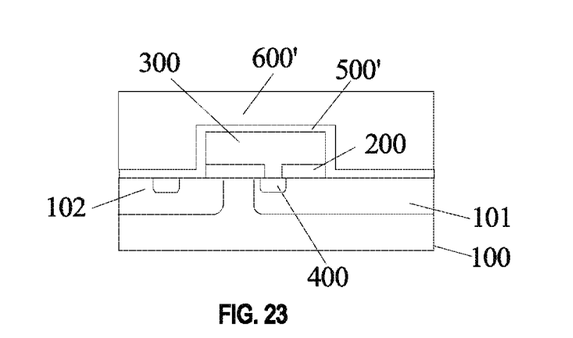
FIG. 23 is a cross-sectional view of a semi-floating gate transistor structure illustrating an N-type doped polysilicon layer on the insulating layer of FIG. 22, in accordance with an embodiment of the present invention.
Figure 24:
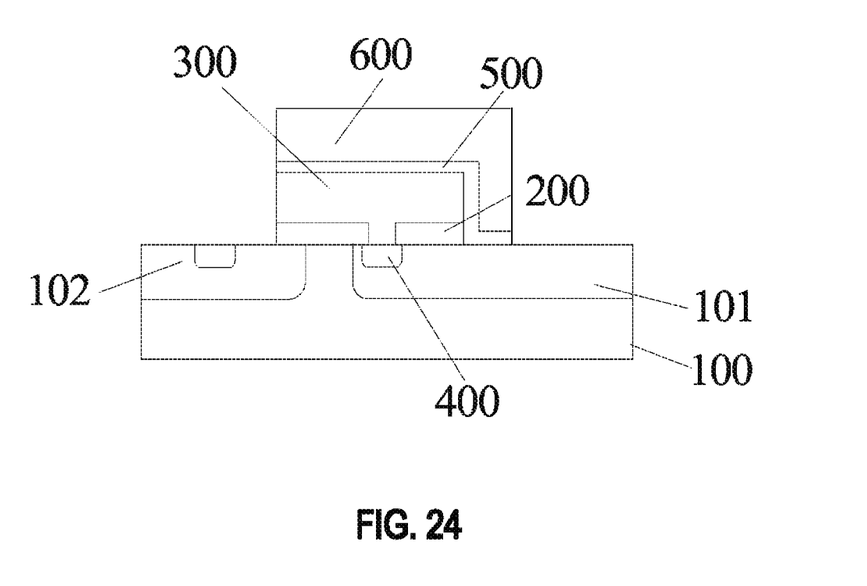
FIG. 24 is a cross-sectional view of a semi-floating gate transistor structure illustrating the second polysilicon layer and the insulating layer after etching of FIG. 23, in accordance with an embodiment of the present invention.

Referring to FIGS. 19 and 20, a method according to an embodiment of the present invention includes etching polysilicon layer 300' and oxide layer 200' to form a semifloating gate transistor structure 300 and a gate oxide layer 200, respectively, as shown in FIG. 21. Referring to FIG. 9, semi-floating gate transistor structure 300 includes a first floating portion 301 disposed within separation groove 203 and a second floating portion 302 overlying gate oxide layer 200. The method also includes forming an insulating layer 500' on floating gate 300 and the exposed surface of substrate 100, as shown in FIG. 22. The method further includes forming a second polysilicon layer 600' overlying insulating layer 500' and sequentially etching second polysilicon layer 600' and insulating layer 500' to form a control gate 600 and a semi-floating gate transistor structure 500, as shown in FIG. 24. Forming insulating layer 500', second polysilicon layer 600' and subsequently etching insulating layer 500', second polysilicon layer 600' can utilize any convention deposition and etching techniques, which will not be described herein for the sake of brevity. After etching first polysilicon layer 300', the method further includes forming source or drain region in second N-well region 102 and a portion of first N-well region, since heavily doped N-type region 400 is covered, so that the performance of the semi-floating gate transistor structure will not be adversely affected.

In an embodiment, a method includes forming an interlayer dielectric layer 500' on floating gate 300' and forming an N-type doped polysilicon layer 600' overlying insulating layer 500' and the exposed surface of substrate 100, subsequently etching polysilicon layer 600, insulating layer 500', first polysilicon layer 300', and oxide layer 200'. After etching, first polysilicon layer 300' becomes semi-floating gate transistor structure 300, interlayer dielectric layer 500' becomes semi-floating gate transistor structure 500, second polysilicon layer 600' becomes control gate 600, as shown in FIG. 8B.

Interlayer dielectric layer 500' may be a silicon oxide layer, a silicon nitride layer, composite insulating layer having a single layer or a multiple layers of aluminum oxide layer, hafnium oxide layer, or a silicon oxide layer, a silicon nitride layer, and a silicon oxide layer (ONO) structure.

Embodiments of the present invention provide many advantages and benefits. By forming a pn-junction diode having a P-type doped floating gate disposed on the substrate, an etching of the substrate is not required that may damage the crystalline structure of the substrate resulting in an increase in leakage current and power consumption.

The foregoing description has provided by way of exemplary and non-limiting examples a full description of the invention. However, various modifications and adaptations may become apparent to those skilled in the art in view of the foregoing description, when read in conjunction with the accompanying drawings and the appended claims. Thus, such and similar modifications of the teachings of the invention will fall within the scope of this invention.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semi-floating gate transistor structure, the method comprising:
   providing a substrate having a first N-well region and a second N-well region separated from each other;
   forming an oxide layer disposed on the first N-well region of the substrate;
   forming a groove in the oxide layer to expose a surface region of the substrate;
   performing an N-type ion implantation into the substrate to form a heavily doped N-type region in the surface region of the substrate corresponding to a location of the groove in the oxide layer; and
   forming a P-type doped first polysilicon layer on the oxide layer, the P-type doped first polysilicon layer filling the groove in the oxide layer.

2. The method of claim 1, wherein forming the oxide layer and forming a groove in the oxide layer comprise:
   sequentially forming a first oxide layer on the substrate and an etch stop layer on the first oxide layer;
   sequentially etching the etch stop layer and the first oxide layer to form an opening exposing a surface of the first N-well region and a surface of the second N-well region;
   forming a sidewall layer on sidewalls of the opening;
   forming a second oxide layer on the exposed surface of the first and second N-well regions; and
   removing the sidewall layer and the etch stop layer to form a groove between the first oxide layer and the second oxide layer, a width of the groove being determined by a thickness of the sidewall layer.

3. The method of claim 2, wherein forming the sidewall layer comprises:
   depositing a sidewall material layer on the opening and the etch stop layer;
   etching the sidewall material layer to form the sidewall layer, the sidewall material layer and the etch stop layer comprising a same material.

4. The method of claim 3, wherein depositing the sidewall material layer comprises a chemical vapor deposition process, and etching the sidewall material layer comprises an anisotropic etching process.

5. The method of claim 4, wherein the anisotropic etching process comprises CF4, O2, and N2 gas.

6. The method of claim 3, wherein the sidewall material layer comprises silicon nitride or silicon oxynitride.

7. The method of claim 2, wherein sequentially forming the first oxide layer on the substrate comprises a first thermal oxidation process, and forming the second oxide layer comprises a second thermal oxidation process.

8. The method of claim 2, further comprising:
   before forming the P-type doped first polysilicon layer, etching a groove in the heavily doped N-type region in the surface region of the substrate through the groove in the oxide layer.

9. The method of claim 1, further comprising, after forming the P-type doped first polysilicon layer:
   forming an insulating layer on the first polysilicon layer;
   forming a second polysilicon layer on the insulating layer;
   sequentially etching the second polysilicon layer, the insulating layer, the first polysilicon layer, and the oxide layer, wherein:
   the etched oxide layer is a gate oxide layer,
   the etched first polysilicon layer is a floating gate,
   the etched insulating layer is an interlayer dielectric layer,
   the etched second polysilicon layer is a control gate.

10. The method of claim 9, wherein the insulating layer comprises an ONO structure.

11. The method of claim 1, further comprising, after forming the P-type doped first polysilicon layer:
   sequentially etching the first polysilicon layer and the oxide layer, the etched first polysilicon layer being a floating gate of a semi-floating gate transistor structure and the etched oxide layer being a gate oxide layer;
   forming an insulating layer on the floating gate and an exposed surface of the substrate;
   forming an N-type doped or a P-type doped second polysilicon layer on the insulating layer;
   sequentially etching the second polysilicon layer and the insulating layer, the etched insulating layer being an interlayer dielectric layer of the semi-floating gate transistor structure, the etched second polysilicon layer being a control gate of the semi-floating gate transistor structure.

12. The method of claim 11, wherein the insulating layer comprises an ONO structure.

13. The method of claim 1, wherein the heavily doped N-type region is doped at an N-type doping concentration in the range between $10^{15}$ and $10^{20}/cm^3$.

* * * * *